(12) United States Patent
Livolsi et al.

(10) Patent No.: US 6,801,069 B1
(45) Date of Patent: *Oct. 5, 2004

(54) RECEIVING LATCH WITH HYSTERESIS

(75) Inventors: Robert R. Livolsi, Shokan, NY (US);
Juergen Pille, Stuttgart (DE)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1023 days.

(21) Appl. No.: 09/071,912

(22) Filed: May 4, 1998

(51) Int. Cl.$^7$ .................. H03K 3/356; H03K 3/037; H03K 3/12; H03K 3/286
(52) U.S. Cl. ...................... 327/208; 327/218
(58) Field of Search .................. 327/200, 201, 327/208, 209–212, 217, 218

(56) References Cited

U.S. PATENT DOCUMENTS

| | | | |
|---|---|---|---|
| 4,079,301 A | | 3/1978 | Johnson, III ............. 318/338 |
| 4,280,091 A | | 7/1981 | Hiltner .................. 323/315 |
| 4,535,294 A | | 8/1985 | Ericksen et al. ........... 327/58 |
| 5,324,996 A | * | 6/1994 | Mote, Jr. ................ 326/21 |
| 5,469,386 A | * | 11/1995 | Obara ................. 365/189.07 |
| 5,740,119 A | * | 4/1998 | Asakura et al. ........... 365/222 |
| 5,774,005 A | * | 6/1998 | Partovi et al. ........... 327/210 |
| 5,812,002 A | * | 9/1998 | Yoshida ................. 327/210 |

OTHER PUBLICATIONS

"Switch Mode Power Supply For CRT Display" IBM Technical Disclosure Bulletin, vol. 29, No. 9, Feb. 1987, pp. 3921–3922.
"Transistor Rectifier Regulator" IBM Technical Disclosure Bulletin, Nov. 1979, pp. 2319–2320.

* cited by examiner

Primary Examiner—Tuan T. Lam
(74) Attorney, Agent, or Firm—Lynn L. Augspurger

(57) ABSTRACT

A receiving latch with hysteresis circuit for receiving data on cross chip boundaries in a chip to chip interface has a clock section and a feed section and a hysteresis latch section with the feed section receiver enable input pin for a dataline passing through the receiver feed section and hysteresis latch section. The receiver enable input pin D is settable to a high or low voltage level, respectively turning the hysteresis latch section on said dataline ON or OFF. The hysteresis latch pass gate has clock couplings to the pgate and ngate of the PFET and NFET transistors of the pass gate. The drains of said pass gate PFET and NFET are coupled to ground and their sources to a positive potential provided over said data line. The drain of a latch PFET has its source connected to a positive potential and the source of an latch NFET has having its drain connected to ground and both the latch PFET and NFET have their gate connection to the dataline latch output for gating the dataline information out of the latch from the latch gates of the hysteresis latch section.

3 Claims, 1 Drawing Sheet

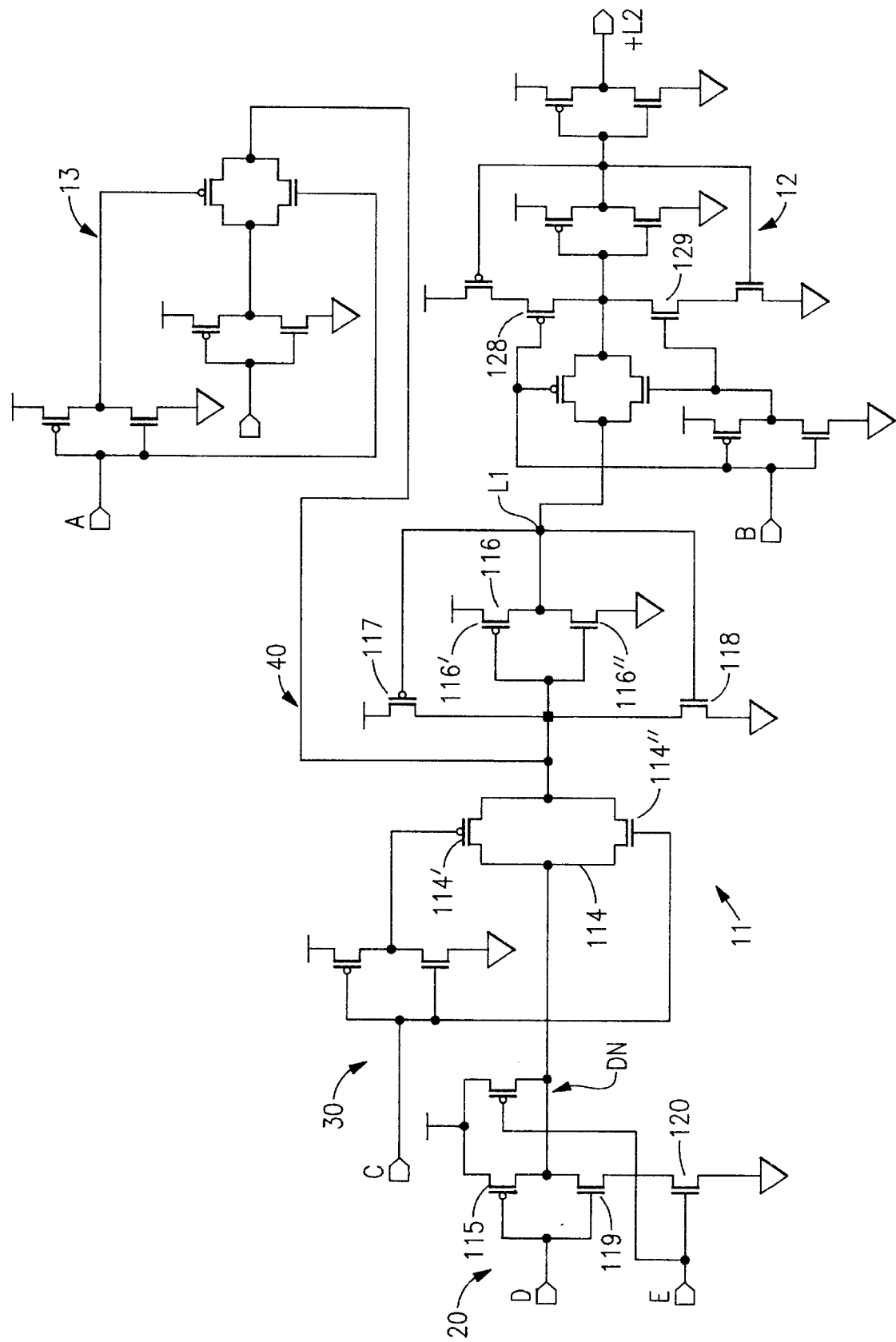

RECEIVING LATCH WITH HYSTERESIS

FIELD OF THE INVENTION

This invention is related to circuits, and particularly to CMOS circuits for use in computers where has been a need for a receiver and a latch which is fulfilled by our hysteresis latch circuit.

BACKGROUND OF THE INVENTION

In the past circuits for use in computers there has been a need for a receiver and a latch for setting a hysteresis for a circuit.

SUMMARY OF THE INVENTION

Our invention provides a circuit which eliminates elements of prior art circuits and provides a hysteresis latch.

These and other improvements are set forth in the following detailed description. For a better understanding of the invention with advantages and features, refer to the description and to the drawings.

BRIEF DESCRIPTION OF THE DRAWINGS

FIG. 1 shows our preferred embodiment of a hysteresis latch in the environment where it can be used.

DETAILED DESCRIPTION OF THE INVENTION

Before considering our preferred embodiments in detail, it will be understood the the receiving latch with hysteresis circuit we developed is useful in receiving data on cross chip boundaries in a chip to chip interface. FIG. 1 which illustrates our preferred embodiment also illustrates a typical latch which can be seen to differ from our hysteresis latch circuit which is implemented in CMOS. The abbreviation here PFET is used to refer to a p channel field effect transistor device. NFET is used to refer to an n channel field effect transistor device. In todays technology PFETS are normally non-conducting between the source electrode and drain electrode when the gate-to-source potential is relatively negative, an opposite condition from that obtained from an NFET device's relative biasing.

Turning now to our invention in greater detail, it will be seen from FIG. 1 which illustrates our preferred embodiment that our hysteresis latch is a new circuit which combines the function of a traditional receiver and latch, essentially eliminating elements of the latch while providing the receiver function as a hysteresis latch combination. In our preferred embodiment our hysteresis latch provides output to an L2 latch at the interface from our hysteresis latch. Also, In the example shown, the hysteresis latch can be coupled to receive a scannable input from a test input having an A clock for loading test vectors into the latch. This is but one example where our latch can be used.

In the illustrated embodiment a data path beginning with data input D allows the passage of information from the input pad D to the L1 node where it is available as output.

In order to illustrate in more detail, FIG. 1 illustrates typical circuits which could employ our hysteresis latch in an L1, L2 latch arrangement for clocking data to an output of L2 at the L2 pad of the B clock circuit generally illustrated at 12. Other than the fact that the L1 out node of our preferred hysteresis latch 11 is common to the circuits along the data path, B clock circuit 12 does not use our hysteresis latch. Neither does the A clock circuit 13. However, the B clock circuit 12 does illustrate how a typical latch circuit is normally configured in the art and this typical latch will use an eliminated PFET 128 and an eliminated NFET 129 which are not employed in the hysteresis latch section 40 of the receiving hysteresis latch circuit 11 which includes a feed section 20, a clock section 30 and the hysteresis latch 40 section.

The hysteresis latch circuit 11 has a receiver data input D providing data along the data path from input D to the output node L1. An active high level data line clock voltage is indicated by a positive-going clock signal voltage, while an active low level data line clock level is indicated with a negative going clock signal. As the receiver enable pin E is settable to a high or low voltage level, it is respectively turning the hysteresis latch section ON or OFF while providing the initial input to the dataline. Clocking is supplied for the hysteresis latch circuit by a clock, in this illustration it is supplied by the C clock. A C clock high level turns the hysteresis latch section pass gate 114 ON, enabling the hysteresis path. The receiver hysteresis latch section consists of a dataline input to pass gate 114, (C) clock couplings to the pgate and ngate of PFET 114' and NFET 114" transistors of the pass gate 114, whose drains are coupled to ground and whose sources pass the data line information to the drain of a latch PFET 117 and the source of an latch NFET 118 at a node of the dataline to latch and gate the dataline information out of the latch from the gates of PFET 117 and NFET 118 respectively to the output node L1 of the receiving latch with hysteresis when used for cross chip boundary interface connections. A low level zero on the data input pad D turns the data input PFET 115 ON, raising the data input node DN output of the feed section 20 to a high level (and passing through the pass gate 114) and turns ON inverter 116 of the hysteresis section of the latch which turns ON latch PFET 117 and turns OFF latch NFET 118. As voltage on the input pad D begins to rise, input gate PFET 115 turns OFF which turns OFF input gate NFET 119 (when receiver section NFET 120 is on) forming a path of contention through pass gate 114 with the latch PFET 117. As the threshold voltage on the data input D pad's node DN falls to a low level through pass gate 114 and inverter 116 this turns OFF latch PFET 117 while turning ON latch NFET 118. When Clock goes low turning OFF the pass gate 114 data is latched at node L1.

On the other hand in this illustration, when C clock is high turning ON pass gate 114 and data at pad D is in a high state this turns OFF data input gate threshold PFET 115 and ON NFET 119 bringing node DN low through pass gate 114 and through inverter 116 having a PFET 116' and NFET 116" connected as shown with the data line connected to their gates respectively and the PFET 116' drain connected to the output node L1 and the NFET source connected to the output node L1 turning latch PFET 117 OFF and latch NFET 118 ON. As data on data input pad D begins to fall, turning data input gate threshold PFET 115 ON, this creates a contention path through pass gate 114 with NFET 118. At the receiver down level threshold PFET 115 turns ON completely and NFET 119 turns OFF bringing node DN high through pass gate 114 and through inverter 116 turning PFET 117 ON and NFET 118 OFF. Then when the (C) clock goes low data is latched in node L1.

While we have described our preferred embodiments of our invention, it will be understood that those skilled in the art, both now and in the future, may make various improvements and enhancements which fall within the scope of the claims which follow. These claims should be construed to maintain the proper protection for the invention first disclosed.

What is claimed is:

1. A receiving latch with hysteresis circuit for receiving data on cross chip boundaries in a chip to chip interface, comprising a receiver enable input pin (E), a data line (D to L1), a receiver latch circuit section including a receiver feed section (20,115,119,120), a clock section (30) and a hysteresis latch (40,114,114' 114",116,116',116",117,118) having a pass gate (114), configured so that said receiver enable input pin (E) is settable to a high (Data ON) or low (Data OFF) voltage level to set the hysteresis for the receiver latch circuit section and also to gate any input data at a data input pad (D) to the data line setting the hysteresis of the receiver latch circuit section when the voltage level at said enable input pin (E) goes high, and wherein a clock signal is supplied by the clock section of said receiver latch circuit section, and said receiver feed section supplies a data line output (DN) of said receiver feed section to the hysteresis latch having said pass gate (114), and wherein said hysteresis latch with the pass gate has clock couplings to a pgate and an ngate of a pass gate PFET (114') and a pass gate NFET (114") transistor of the pass gate (114), respectively, with the drains of said pass gate PFET (114') and pass gate NFET (114") being coupled to ground via hysteresis latch NFET (118) of said hysteresis latch and with the sources of said pass gate PFET (114') and pass gate NFET (114") coupled to the input data line via the data line output (DN) of said receiver feed section, the drain of a hysteresis latch PFET (117) of said hysteresis latch having its source connected to a positive potential and the source of said hysteresis latch NFET (118) having its drain connected to ground and both said hysteresis latch PFET (117) and said hysteresis latch NFET (118) having their gate connection to a data line latch output (L1) for gating the data line information out of the hysteresis latch (40).

2. The receiving latch with hysteresis circuit according to claim 1 wherein said receiver feed section of said receiver latch circuit section is provided with a data input gate having a feed section data input gate PFET (115) transistor and an data inputs gate NFET transistor (119) in said receiver feed section and wherein a low level on the data input pad (D) turns the data input gate PFET ON, raising said data line output (DN) on the data line to a high level to raise the input to the pass gate (114) to high and to turn ON an inverter circuit (116) of said hysteresis latch which is coupled to said pass gate (114) which turns ON an inverter latch PFET (116') of said inverter circuit (116) of said hysteresis latch and turns OFF an inverter latch NFET (116") of said inverter circuit (116) of said hysteresis latch, while as voltage on the data input pad (D) begins to rise, said feed section data input PFET's gate (115) transistor turns OFF which turns OFF said data input gate NFET transistor (119) forming a path of contention through said pass gate (114) with said hysteresis latch PFET (117), such that a threshold voltage on the data input pad (D) causes said data node output (DN) on the dataline to fall to a low level through said pass gate (114) and said inverter circuit (116) to turn OFF said hysteresis latch PFET (117) while turning ON said hysteresis latch NFET (118), and wherein when said clock goes low it turns OFF the pass gate (114) and data is latched at a data line latch output (L1) of the hysteresis latch (40).

3. The receiving latch with hysteresis circuit according to claim 2 wherein when said clock signal goes high it turns ON said pass gate (114) and when said data input pad (D) is in a high state this turns OFF said feed section data input gate PFET (115) and data input gate NFET (119) ON bringing the data line output (DN) data line low through said pass gate (114) and through said inverter turning said hysteresis latch PFET (117) OFF and said hysteresis latch NFET (118) ON, and when said data input pad (D) begins to fall, this turns ON the data input gate PFET (115) and turns OFF said data input gate NFET transistor (119) and creates a contention path through said pass gate (114) with the hysteresis latch NFET (118), so that at the receiver down level the data input gate PFET (115) turns ON completely and data input gate NFET transistor (119) turns OFF bringing the data line output (DN) data line high through said pass gate (114) and through said inverter to turn latch PFET (117) ON and latch NFET (118) OFF so that when said clock signal goes low data is latched in an output latch (L1) of the hysteresis latch (40).

* * * * *